United States Patent
Bhatt et al.

(10) Patent No.: US 6,569,604 B1
(45) Date of Patent: May 27, 2003

(54) BLIND VIA FORMATION IN A PHOTOIMAGEABLE DIELECTRIC MATERIAL

(75) Inventors: Anilkumar Chinuprasad Bhatt, Johnson City, NY (US); Francis Joseph Downes, Jr., Vestal, NY (US); Robert Lee Lewis, Apalachin, NY (US); Voya R. Markovich, Endwell, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/345,723

(22) Filed: Jun. 30, 1999

(51) Int. Cl.$^7$ ................................. G03C 5/00
(52) U.S. Cl. ................. 430/311; 430/313; 430/319; 430/320; 430/322
(58) Field of Search ................. 430/311, 313, 430/317, 319, 320, 326, 323, 324, 270.1

(56) References Cited

U.S. PATENT DOCUMENTS

| | | | |
|---|---|---|---|
| 5,098,815 A | * 3/1992 | Adamezyk et al. | ......... 430/315 |
| 5,239,260 A | * 8/1993 | Widder et al. | ........... 324/159 P |
| 5,239,448 A | 8/1993 | Perkins et al. | |
| 5,266,446 A | 11/1993 | Chang et al. | |
| 5,308,929 A | 5/1994 | Tani et al. | |
| 5,509,553 A | 4/1996 | Hunter, Jr. et al. | |
| 5,532,110 A | 7/1996 | Ngo | |
| 5,656,414 A | * 8/1997 | Chou et al. | ................. 430/312 |
| 5,709,979 A | 1/1998 | Casson et al. | |
| 5,784,781 A | * 7/1998 | Shirai et al. | ................... 29/846 |
| 5,786,270 A | * 7/1998 | Gorrell et al. | .............. 438/613 |
| 6,185,354 B1 | * 2/2001 | Kronz et al. | ................ 385/129 |
| 6,214,441 B1 | * 4/2001 | Liu et al. | ..................... 428/156 |

OTHER PUBLICATIONS

"High Performance Carrier Technology: Materials And Fabrication", by Light et al, 1993 International Electronics Packaging Conference, San Diego, California, vol. One.

"High Performance Carrier Technology", by Heck et al, 1993 International Electronics Packaging Conference, San Diego, California, vol. One.

"Process Considerations in the Fabrication of Teflon Printed Circuit Boards", by Light et al, 1994 Proceedings, 44 Electronic Components & Technology Conference, 5/94.

* cited by examiner

Primary Examiner—Janet Baxter
Assistant Examiner—Yvette C. Thornton
(74) Attorney, Agent, or Firm—Schmeiser, Olsen & U Watts; Lawrence R. Fraley

(57) ABSTRACT

A blind via structure, and associated laser ablation methods of formation, that includes a blind via within a photoimageable dielectric (PID) layer on a substrate, such that the sidewall of the blind via makes an obtuse angle with the blind end of the blind via. The obtuse-angled sidewall may be formed by executing two processes in sequence. In the first process, photoimaging of the PID layer, with selective exposure to ultraviolet light, results in one or more blind vias having acute-angled sidewalls. The photoimaging cross links the PID material that had been selectively exposed to ultraviolet light such that a subsequent developing step removes PID material not cross linked, or weakly cross linked, to simultaneously form multiple blind vias having different sized openings. In the second process, laser ablation is selectively employed to remove the acute-angled sidewalls from particular blind vias in a way that forms replacement obtuse-angled sidewalls in the laser-ablated blind vias. Alternatively, the first process involving photoimaging may be omitted such that the second step involving laser ablation forms the entire obtuse-angled blind via. The resultant blind via structure includes at least one blind via having an obtuse-angled sidewall, and optionally, at least one blind via having an acute-angled sidewall.

22 Claims, 8 Drawing Sheets

BLIND VIA FORMATION IN A PHOTOIMAGEABLE DIELECTRIC MATERIAL

BACKGROUND OF THE INVENTION

1. Technical Field

The present invention relates to a blind via structure, and associated laser ablation methods of formation, that includes a blind via within a photoimageable dielectric (PID) layer on a substrate, such that the sidewall of the blind via makes an obtuse angle with the blind end of the blind via.

2. Related Art

Electronic structures commonly include blind vias coupled to a dielectric substrate. A blind via is characterized by an open end and a closed end ("blind end"). If the sidewall of a blind via is plated with metal and subsequently treated with solder, the blind via may serve to electrically couple a circuitization layer on the substrate with such electrical interconnects as a ball grid array (BGA) or a controlled collapse chip connection (C4) solder ball. The BGA may be coupled to an electronic carrier such as a circuit card. The C4 solder ball, which may have any utilizable geometrical shape such as a spherical or columnar structure, may be coupled to an electronic assembly such as a chip. A blind via may be formed within a dielectric substrate by mechanical drilling or by laser ablation. With either method of blind via formation, each blind via must be individually and separately formed. This is costly and time-consuming for electronic structures that require numerous blind vias on the same dielectric substrate.

A known method of forming blind vias simultaneously includes use of a photoimageable dielectric (PID) material. If a PID layer is formed on a substrate, blind vias may be formed within the PID layer by a known photoimaging process that cross links (i.e., polymerizes) photoexposed PID material and allows multiple blind vias within the PID layer to be formed simultaneously. This known process is illustrated in FIGS. 1–4.

FIG. 1 shows a front cross-sectional view of a PID layer 12 on a substrate 10 for the purpose of forming one or more blind vias within the depth of the PID layer 12. In particular, FIGS. 1–4 depict the formation of two blind vias of different widths. The PID layer 12 may be formed on the substrate 10 by any known method in the art. A preliminary step in the process of blind via formation is baking the PID layer 12 (on the substrate 10) at a temperature, such as between 85 and 95° C., that will evaporatively remove residual solvents within the PID material. The residual solvents are impurities that may interfere with cross linking of the subsequently photoexposed PID material.

In FIG. 2, a mask layer 14 has been placed on the PID layer 12. The mask layer 14 includes an opaque region 16 and an opaque region 18. The opaque region 16 and the opaque region 18, which may be formed inter alia by emulsions on a glass-plate representation of the mask layer 14, are located above portions in the PID layer 12 where blind vias will be subsequently formed. The mask layer 14 also includes a transparent region 30. The PID layer 12 includes a blocked region 26 under the opaque region 16, a blocked region 28 under the opaque region 18, and an unblocked region 34 under the transparent region 30.

Referring to FIG. 3, blind vias will be subsequently formed from the blocked region 26, the first blocked region 28, and portions (called "soft" regions) of the unblocked region 34. A soft region includes a portion of the unblocked region 34 which contacts a blocked region and is geometrically positioned to be subsequently etched away, as will be explained infra. As shown in FIG. 3, the unblocked region 34 includes a soft region 27 which contacts the blocked region 26, a soft region 29 which contacts the blocked region 28, and a hard region 32 which include all portions of the unblocked region 34 which are not soft regions. As will be described infra and depicted in FIG. 4, a first blind via 46 will be subsequently formed from the blocked region 26 and the soft region 27, and a second blind via 48 will be subsequently formed from the blocked region 28 and the soft region 29.

FIG. 3 depicts an "exposure" step in which a light source 20 directs light 22 of a suitable wave length, such as ultraviolet radiation, onto the mask layer 14. The light 22 passes through the transparent region 30 of the mask layer 14 into the unblocked region 34 of the PID layer 12. The light 22 initiates a cross-linking process which polymerizes the PID-exposed material in the unblocked region 34. The rate and magnitude of cross linking decreases with increasing distance in the direction 60 as measured from the top surface 36 of the unblocked region 34. PID material that is not cross linked (i.e., PID material in the blocked region 26 and in the blocked region 28) tends to dissolve, or be washed away, if contacted by a developer solution. PID material that is cross linked (i.e., PID material in the unblocked region 34, especially in the hard region 32) tends to resist being dissolved if contacted by a developer solution. After the preceding exposure step, the mask layer 14 is removed.

After the exposure step, the PID layer 12 may optionally be allowed to stand at room temperature for a period of time, typically between a half-hour and two hours. This optional "standing" step relates to the fact that the cross linking process in the unblocked region 34 may continue to occur even after exposure of the mask layer 14 to the light 22 has been terminated. The time duration of the standing step, and whether the standing step should be utilized, depends on the cross-linking characteristics of the PID material in relation to the light 22; i.e., on the rate of crosslinking that occurs both during and after exposure of the mask layer 14 to the light 22 in consideration of the amount of cross linking that prevents light-exposed PID material from being washed away by a subsequently-applied developer solution.

After the mask layer 14 is removed, and after the exposure step (or after the standing step if elected), the PID layer 12 is exposed to a developer solution, such as by spraying, which washes away the PID material that has not been cross linked or sufficiently cross linked. In this "developing" step, the washing away of the non-polymerized PID material in the blocked region 26, and of the insufficiently polymerized PID material in the soft region 27, results in formation of the first blind via 46 as shown in FIG. 4. In FIG. 3, the PID material in the soft region 27 is insufficiently cross linked to resist being washed away because of the attenuation of cross linking with increasing distance in the direction 60, as stated previously. In effect, the less cross-linked PID material at the bottom of the soft region 27 is more susceptible to being washed away by developer solution than is the more cross-linked PID material at the top of the soft region 27. Thus, after the developer solution washes away the non-polymerized PID material in the blocked region 26, the residual developer solution within the blocked region 26 contacts and washes away the insufficiently cross linked material in the soft region 27. Similarly, the washing away of the non-polymerized PID material in the blocked region 28, and of the insufficiently polymerized PID material in the soft region 29, results in formation of the second blind via 48 as shown in FIG. 4. A blind via formed as described above, such as the first blind via 46 or the second blind via 48, is called a "photovia". After the preceding developing step, cleaning may be accomplished, if necessary, by any known method such as by rinsing the PID layer 12 with water.

FIG. 4 depicts a sidewall 56 of the first blind via 46 as making an angle $\theta_1$ with respect to the blind end (i.e., bottom bounding surface) 52 of the first blind via 46. Similarly, the sidewall 58 of the second blind via 48 makes an angle $\theta_2$ with respect to the blind end 54 of the second blind via 48. $\theta_1$ and $\theta_2$ are acute angles (i.e., less than 90 degrees) and result from the washing away of the soft region 27 and the soft region 29, respectively, as described supra in relation to FIG. 3. Definitionally, an acute-angled blind via is a blind via having an acute-angled sidewall such as the sidewall 56 of the first blind via 46, while an obtuse-angled blind via is a blind via having an obtuse-angled sidewall such as sidewall 76 of obtuse-angled blind via 49 with an associated obtuse angle 03 as shown in FIG. 6 (described infra). Thus, the first blind via 46 and the second blind via 48 are acute-angled blind vias. Aside from an undercut region 57, at the bottom of the sidewall 56 in FIG. 4, the shape of the sidewall 56 of the first blind via 46 is typically linear, because the variation of the rate and magnitude of cross linking with distance in the direction 60 is continuous and approximately linear. Similarly, the shape of the sidewall 58 of the second blind via 48 is typically linear, aside from an undercut region 59 at the bottom of the sidewall 58. The undercut regions 57 and 59 may be formed if overdeveloping occurs. If underdeveloping occurs, however, there will be no undercut regions. With underdeveloping, excess PID material may remain at the bottom of the via sidewalls, resulting in a reduction in the width of the blind end 52 of the first blind via 46 and, similarly, a reduction in the width of the blind end 54 of the second blind via 48.

The magnitude of $\theta_1$ depends on the rate of attenuation of cross linking as measured in the direction 60 from the top surface 36 of the unblocked region 34. Accordingly, $\theta_1$ can be increased if the attenuation of cross linking with depth is diminished. Nonetheless, there is a limit as to how large $\theta_1$ can become, because as a top portion of the unblocked region 34 becomes cross linked, the top portion becomes increasingly opaque to the light 22 that triggered the cross linking, which limits the amount of cross linking that can occur below the top portion. Similarly, there is a limit as to how large $\theta_2$ can become. The actual upper limit to $\theta_1$ and $\theta_2$ depends on the cross linking characteristics of the PID material and on such geometric factors as a thickness (d) of the unblocked region 34.

A photovia, such as the first blind via 46 and the second blind via 48, typically undergoes subsequent processing, including metallic plating of conductive metal followed by application of solder to the metallic plating within the blind via. Known methods of plating typically include applying a seeding material on a blind via sidewall, followed by electroless plating of a thin layer (e.g., about 15–100 microinches) of metal such as copper. The seeding is necessary, because a metal such as copper does not directly plate on the organic material of a PID. A currently used seeding material is palladium. Seeding may alternatively be accomplished by sputtering a thin layer of copper (e.g., about 5000 Å) on the blind via sidewall, wherein the sputtered layer of copper serves as a thin layer of seeding material for subsequent plating of a thicker layer of copper (e.g., 1 mil). After the thin layer of copper is formed as described supra, a relatively thicker layer (e.g., 1 mil) of copper is applied by electroplating. In addition to being formed on the first blind via 46 and the second blind via 48, thin and thick layers of copper may also be formed on the top surface 36 of the unblocked region 34, followed by creation of circuit features from the formed copper layers on the top surface 36. After the circuit features are created, there may be additional plating of the copper layers on the top surface 36 and/or the copper layers on the first blind via 46 and the second blind via 48. Such additional plating may include inter alia plating a layer of nickel over the thick layer of copper followed by plating a layer of gold over the layer of nickel. Following the additional plating, a solder bump may be formed in the blind via by inserting solder paste with solder flux in the blind via and reflowing the solder paste to form the solder bump.

The aforementioned method of forming photovias can be advantageously used to form many photovias simultaneously, such as 10,000 or 100,000 photovias. Nonetheless, the acute angles $\theta_1$ and $\theta_2$ present various problems relating to difficulty of accessing the bottom portion of the blind via sidewalls and the fact that the open end of the blind via is narrower than the blind end of the blind via. A first problem is that a blind via sidewall having an acute angle, such as $\theta_1$ and $\theta_2$ may be difficult to reliably plate, regardless of whether the seeding is with palladium or by sputtering of copper, because the portion of the blind via sidewall at the bottom of the sidewall is difficult to access by the seeding and plating material. As a result, metallic plating of the via thins out near the bottom of the blind via sidewall. Thin plating is susceptible to degradation during thermal cycling. The plating is particularly difficult and unreliable if aspect ratio of the blind via (i.e., axial depth/width of open end) is greater than about 1. In FIG. 4, the first blind via 46 has an aspect ratio $\alpha_1$ of $d/w_1$, where $w_1$ is the width of the open end of the first blind via 46 and d is the axial depth of the first blind via 46. The second blind via 48 has an aspect ratio $\alpha_2$ of $d/w_2$, which is less than $\alpha_1$ where $w_2$ is the width of the open end of the second blind via 48 and d is the axial depth of the second blind via 48. If $\alpha_2>1$ and $\alpha_1<1$, then the second blind via 48 may be problematic, while the first blind via 46 is not likely to be problematic. In current practice, PID layers are typically about 2 to 3 mils thick with consequent photovia axial depths of about 2 to 3 mils. If the blind via depth (d) is about 3 mils in FIG. 4, then the width ($w_1$) of the open end of the first blind via 46, and the width ($w_2$) of the open end of the second blind via 48, should each be at least about 3 mils in order to assure reliable plating. Thus with a PID layer thickness of about 3 mils, the aforementioned method of photovia formation with an acute-angle sidewall is unreliable for formation of blind vias if the open end has a width of less than about 3 mils.

A second problem with the aforementioned method of blind via formation characterized by an acute-angled sidewall relates to formation of a solder bump within the blind via. Formation of a solder bump typically involves introduction of solder paste and solder flux into the blind via after formation of a metallic coating on the blind via sidewall. When the solder melts during reflow, the solder flux becomes volatile and forms gases which must escape from the blind via; otherwise trapped flux gases will pressurize within the blind via and push the liquid solder material out of the blind via. Unfortunately, an acute-angled sidewall with an adjoining undercut region in a blind via having an aspect ratio greater than about 1 tends to trap such gases, resulting in the aforementioned propensity to push solder out of the blind via.

A third problem relates to undercut regions that sometimes form at the bottom corners of acute-angled blind vias, such as undercut regions 57 and 59 in FIG. 4. An undercut region limits access to a blind via sidewall, such as access by a seeding solution or a plating solution. An undercut region also tends to trap chemical solutions, which result in less uniform plating within the undercut region. Additionally, an undercut region may trap hydrogen gas that is released by the electroless plating of copper . Thus, an undercut region add to reliability concerns relating to subsequent processing following the blind via formation.

A practical method is needed for forming an obtuse-angled blind via, as opposed to an acute-angled blind via, for situations where an acute-angled blind vias impairs reliability, such as where an aspect ratio of the blind via is greater than about 1.

SUMMARY OF THE INVENTION

The present invention provides an electrical structure, comprising: a substrate, a photoimageable dielectric (PID) layer on the substrate, and a blind via within the PID layer, said blind via having a obtuse-angled sidewall.

The present invention provides a method of forming an electrical structure, comprising: providing a substrate, forming photoimageable dielectric (PID) layer on the substrate, and forming a blind via having an obtuse-angled sidewall.

The present invention has the advantage of generating an obtuse-angled blind via in a PID layer.

The obtuse-angled blind via of the present invention has the advantage of eliminating undercut regions located where an acute-angled sidewall interfaces with a blind end of the acute-angled blind via.

The obtuse-angled blind via of the present invention has the advantage of mitigating reliability problems associated with plating of blind vias and formation of solder bumps within the blind vias. Such reliability problems relate to, inter alia, nonuniformity of seeding, nonuniformity of sputtering, nonuniformity of plating, diminished adhesion between a seed layer and a plating layer, trapping of gas during electroless plating of copper, trapping of gas during formation of solder bumps.

The present invention has the advantage of providing both acute-angled blind vias and obtuse-angled blind vias within a given PID layer, so as to combine the efficiency of simultaneously generating multiple acute-angled blind vias with the selectivity of generating only those obtuse-angled blind vias as are necessary to mitigate reliability problems in subsequent processing steps.

The present invention has the advantage of providing a plurality of stacked PID layers on a given surface of a substrate such that each of the stacked PID layers includes an obtuse-angled blind via.

The present invention has the advantage of providing a plurality of stacked PID layers on a given surface of a substrate such that an obtuse-angled blind via penetrates each of the stacked layers.

The present invention has the advantage of providing a first PID layer on a first surface of a substrate and a second PID layer on a second surface of the substrate, such that the first PID layer and the second PID layer each include an obtuse-angled blind via.

DETAILED DESCRIPTION OF THE INVENTION

Figure 1:
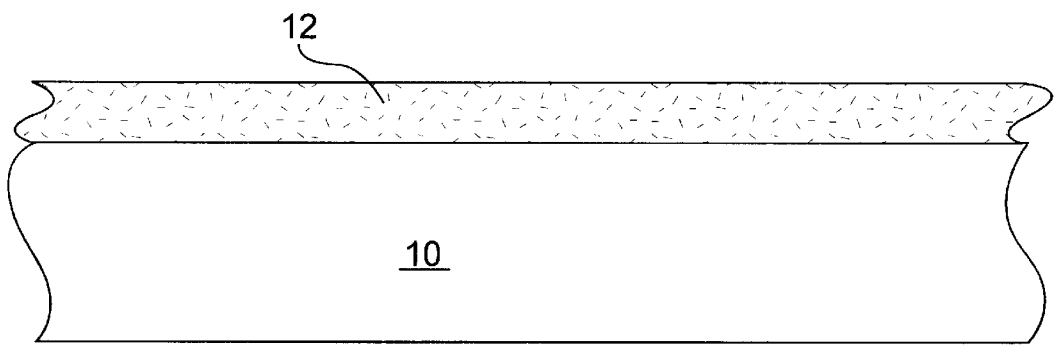
FIG. 1 depicts a front cross sectional view of a PID layer on a substrate.
Figure 2:
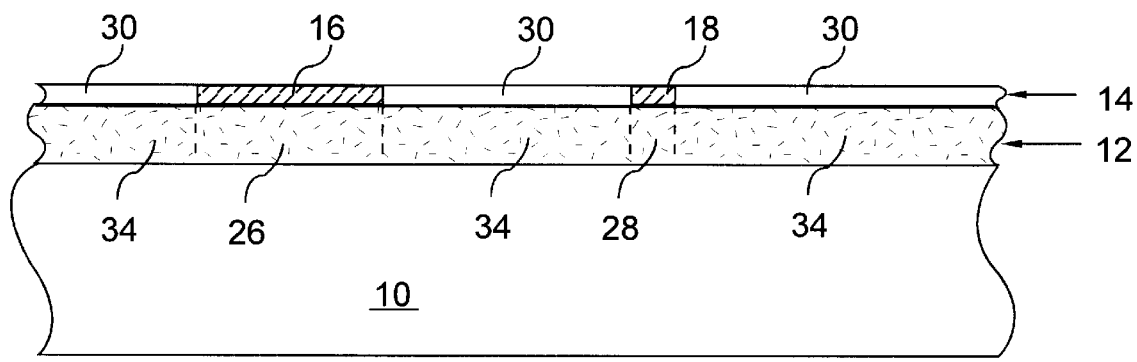
FIG. 2 depicts FIG. 1 after the PID layer is covered by a mask layer.
Figure 3:
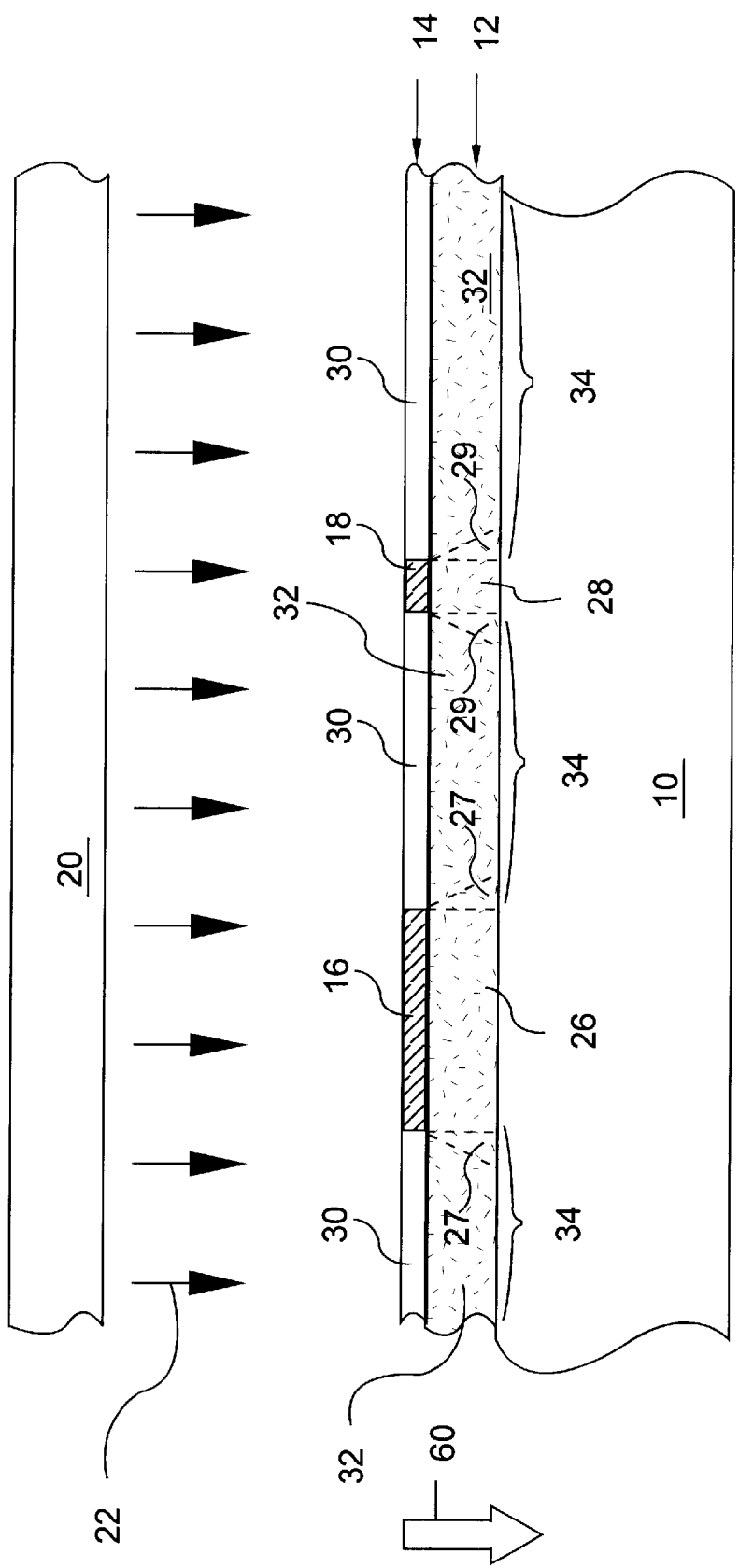
FIG. 3 depicts FIG. 2 with light directed onto the mask layer and into the PID layer.
Figure 4:
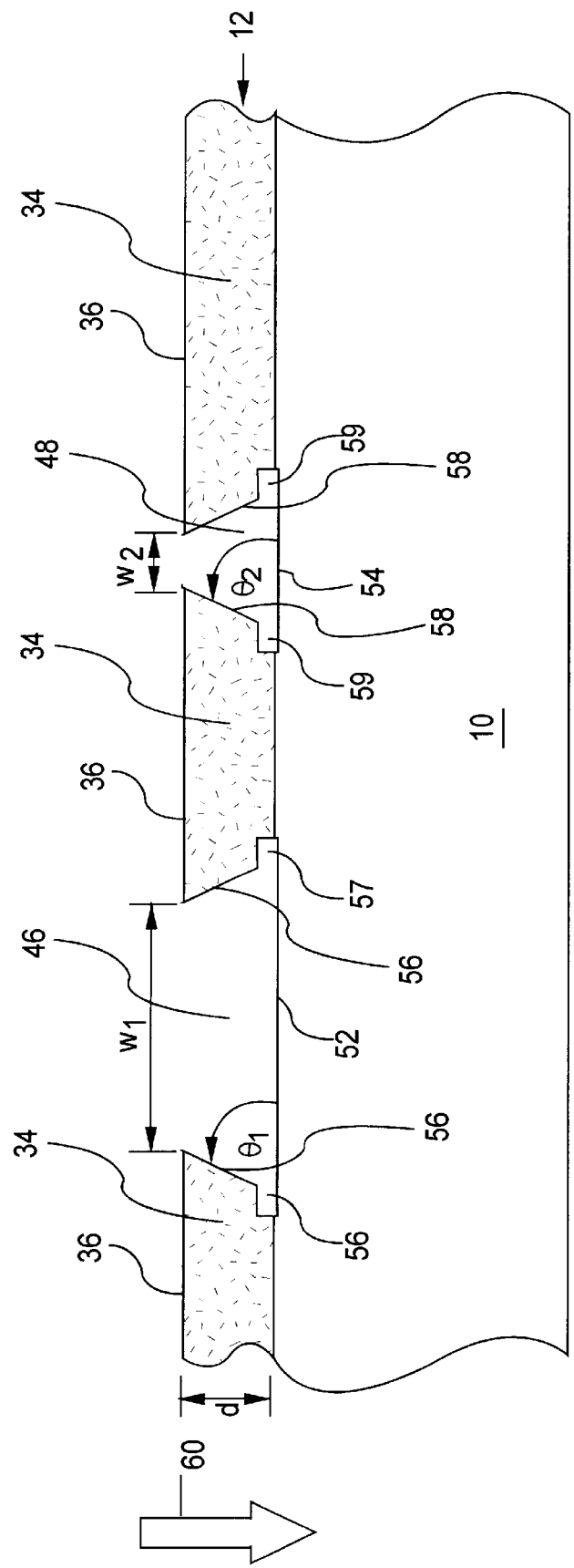
FIG. 4 shows FIG. 3 after the mask layer is removed and acute-angled blind vias are formed in the PID layer as a result of a developing step.

The novel steps of a first preferred embodiment of the present invention begin with the electrical structure of FIG. 4, formed by the photoimaging technique described supra. FIG. 4 shows the first blind via 46 having the acute-angled sidewall 56, and the second blind via 48 having the acute-angled sidewall 58, in the PID layer 34. The aspect ratio $\alpha_1$ of first blind via 46 is assumed to be less than 1, while the aspect ratio $\alpha_2$ of the second blind via 48 is assumed to exceed 1. As discussed supra, an aspect ratio exceeding about 1 with an acute-angled blind via may cause unreliability problems in processing steps subsequent to formation of the blind via. Accordingly, the present invention forms an obtuse-angled blind via, since an obtuse-angled blind via eliminates the aforementioned problems associated with acute-angled blind vias. For example, the inadequate mass transport that occurs in acute-angled blind vias does not occur in obtuse-angled blind vias.

Figure 5:
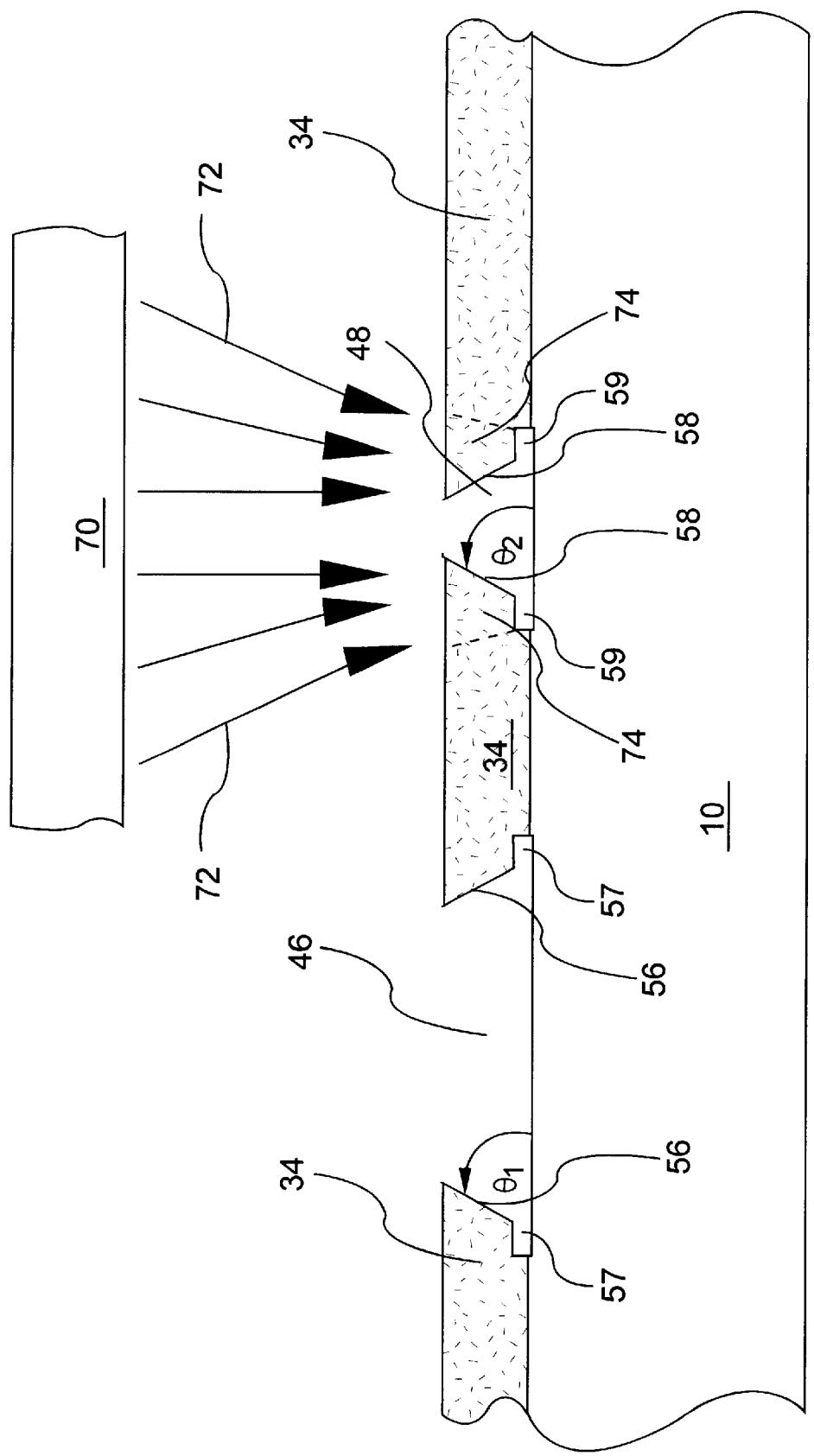
FIG. 5 shows FIG. 4 with laser light directed toward the blind via sidewall, in accordance with a first preferred embodiment of the present invention.
Figure 6:
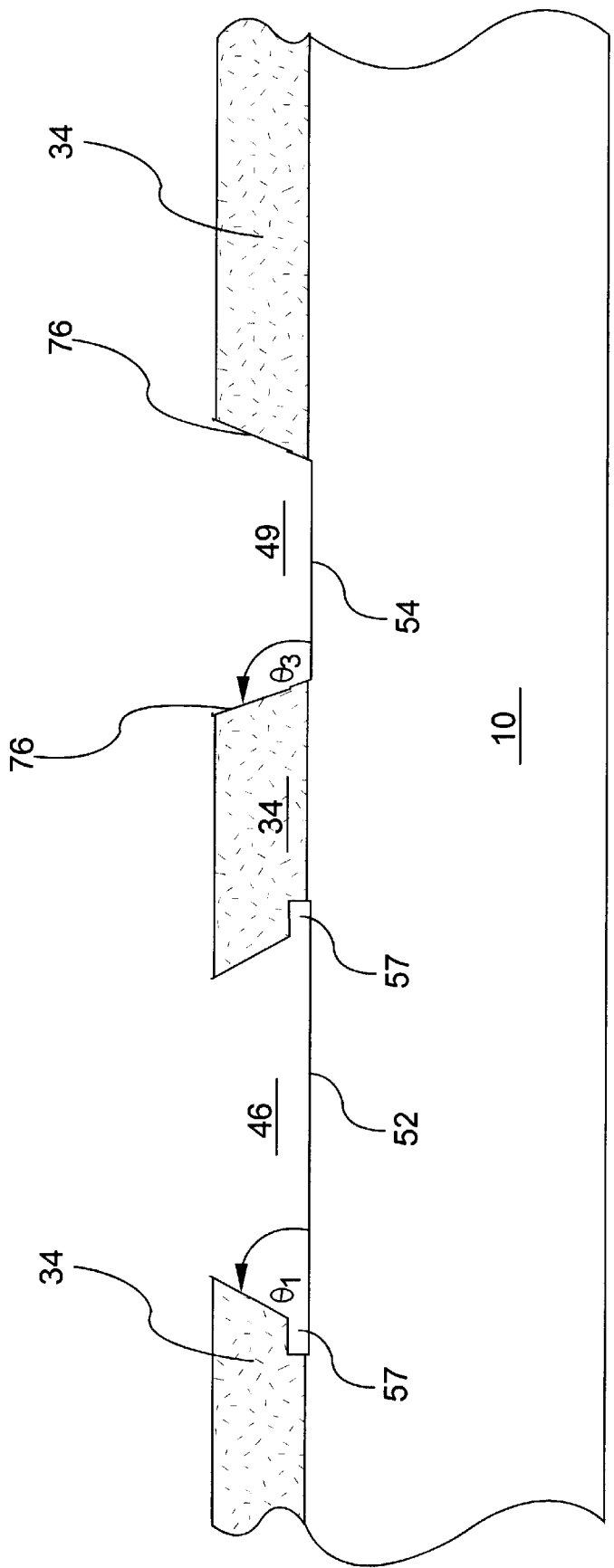
FIG. 6 shows FIG. 5 after laser ablation removes blind via sidewall material to form an obtuse-angled blind via.

As illustrated in FIGS. 5 and 6, the first preferred embodiment transforms the second blind via 48, which has an aspect ratio exceeding 1, into an obtuse-angled blind via 49, by utilizing laser ablation. FIG. 5 depicts laser light 72 of a suitable wavelength (e.g., ultraviolet light) from a laser 70 directed to a subregion 74 of the unblocked region 34, where the subregion 74 is adjacent to the second blind via 48. The laser light 72 ablates the material of the subregion 74, which transforms the second blind via 48 into the obtuse-angled blind via 49 as depicted in FIG. 6. In particular, FIG. 6 shows that the obtuse-angled blind via 49 includes a sidewall 76 which makes an obtuse angle $\theta_3$ with the blind end 54 of the obtuse-angled blind via 49. Although the obtuse angle $\theta_3$ may be any angle that is both greater than 90 degrees and less than 180 degrees, the preferred range for $\theta_3$ is between about 130 degrees and about 160 degrees. The lower limit of about 130 degrees is reliably effective for mitigating problems associated with acute-angled blind vias, discussed supra in the "Related Arts" section. The upper limit of about 160 degrees assures that PID material will not be unnecessarily laser ablated.

Formation of the obtuse angle $\theta_3$ eliminates both the acute angle $\theta_2$ and the undercut region 59 shown in FIG. 5.

Accordingly, the obtuse-angled blind via 49 does not suffer from the disadvantages of acute-angled blind vias stated supra. By having a geometry that allow effective mass transport within the blind via, the obtuse-angled blind via 49 facilitates, during subsequent processing, improved uniformity of seeding and plating as well as open flow paths for elimination of gaseous matter.

While FIG. 6 shows one obtuse-angled blind via and one acute-angled blind via, the present invention may include any number of obtuse-angled blind vias and acute-angled blind vias within a given PID layer, provided that the minimum number of obtuse-angled blind vias is 1 and the minimum number of acute-angled blind vias is 0. An acute-angled blind via is not typically subject to reliability problems if the aspect ratio is below 1, such as for a blind via having a capacitor pad located at the blind end. For example, a capacitor pad at the blind end of a via may have a typical width of about 5 mils, corresponding to an aspect ratio of about 0.4 for a via axial depth of about 2 mils.

It has been noted infra that the transformation of an acute-angled blind via into an obtuse-angled blind via, as accomplished by laser ablation in the preferred embodiment described supra, is particularly useful for acute-angled blind vias having an aspect ratio greater than 1. Nonetheless, the generation of an obtuse-angled blind via for the case of an aspect ratio less than 1 may be useful for special situations and is therefore within the scope of the present invention. For example, it is possible that a metallic plating solution may not adequately cover an acute-angled blind via, even if the aspect ratio is below 1, for a reason unrelated to aspect ratio. In that situation, a retrofitting usage of laser ablation to form an obtuse-angled blind via may solve the plating problem.

Figure 7:
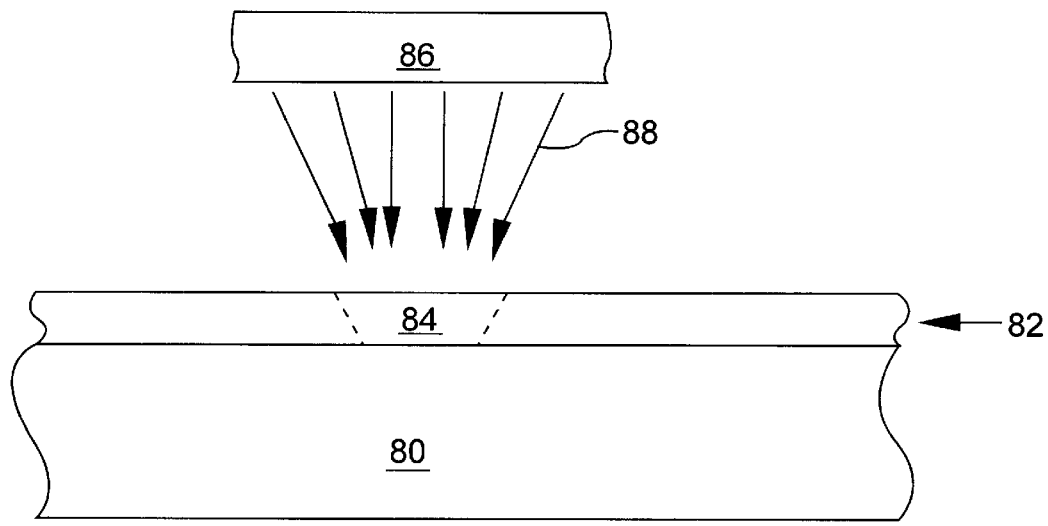
FIG. 7 illustrates a front cross-sectional view of laser light selectively directed on a PID layer, in accordance with a second preferred embodiment of the present invention.
Figure 8:
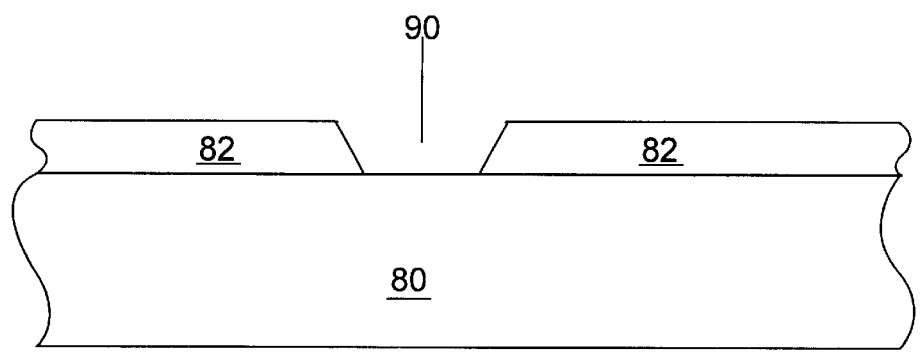
FIG. 8 illustrates FIG. 7 after the laser light has ablated a portion of the PID layer.

A second preferred embodiment of the present invention forms an obtuse-angled blind via in a PID layer directly with a laser without first forming an acute-angled photovia, as depicted in FIGS. 7 and 8. FIG. 8 depicts a front cross-sectional view in which laser light 88 of a suitable wavelength, such as ultraviolet radiation, is directed from a laser 86 to a target region 84 of a PID layer 82, wherein the PID layer 82 is on a substrate 80. The laser ablation of the target region 84 results in formation of an obtuse-angled blind via 90 as depicted in FIG. 8. Forming the obtuse-angled via 90 by laser ablation without a prior photoimaging step may be motivated by reasons of registration. With microstructures that currently exist in typical semiconductor electronics applications, the tolerances for registering (i.e., lining up) of fine structures of a substrate are very tight. In consideration of the expansion and contraction of fine structure that occurs during processing stages, a photoimaging step prior to laser ablation would necessitate the inefficiency of registering the laser to each photoimaged pattern. With the photoimaging eliminated, as in the second preferred embodiment, the laser merely has to be registered to stable internal structures within the substrate with consequent efficiency and accuracy. Note that an acute-angled blind via may be formed in the PID layer 82 by photoimaging, as described in the "Related Art" section, prior to formation of the obtuse-angled via 90 by laser ablation.

Figure 9:
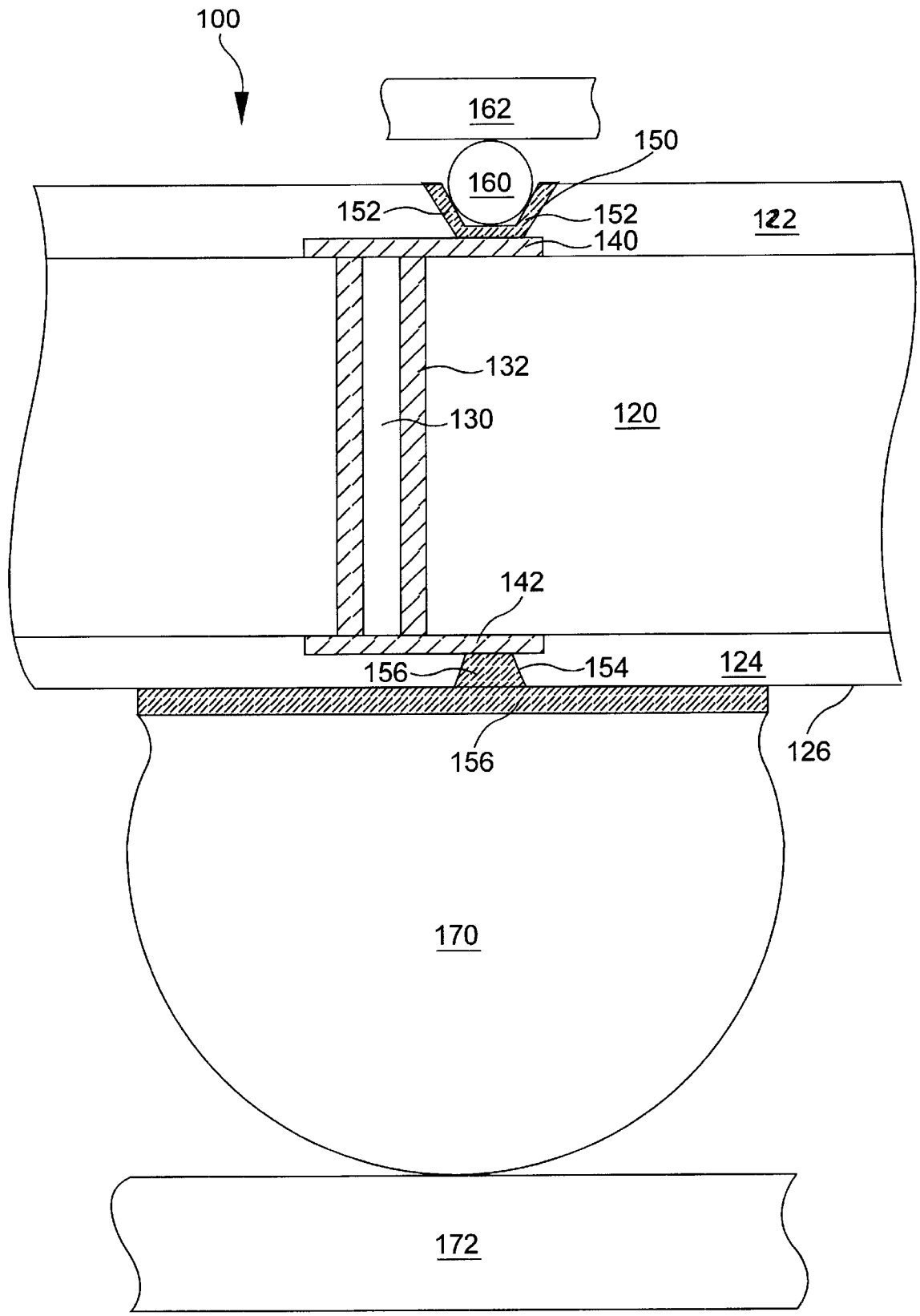
FIG. 9 illustrates a front cross-sectional view of a composite electrical structure, in accordance with a third preferred embodiment of the present invention.

FIG. 9 illustrates a front cross-sectional view of a composite electrical structure 100, in accordance with a third preferred embodiment of the present invention. FIG. 9 depicts a PID layer 122 on substrate 120, and a PID layer 124 on the substrate 120. The PID layer 122 includes an obtuse-angled blind via 150 with a metallic plating 152. The obtuse-angled blind via 150 may be formed either by photoimaging followed by laser ablation, or by laser ablation without prior photoimaging, as described supra. Although not shown, the PID layer 122 may also include an acute-angle blind via formed by photoimaging. The PID layer 124 includes an obtuse-angled blind via 154 covered with a metalization 156 that extends out of the blind via 154 onto a bottom surface 126 of the PID layer 124 in the form of a BGA pad. The obtuse-angled blind via 154 may be formed either by photoimaging followed by laser ablation, or by laser ablation without prior photoimaging, as described supra. Although not shown, the PID layer 124 may also include an acute-angle blind via formed by photoimaging. The obtuse-angled blind via 150 and the obtuse-angled blind via 154 are electrically coupled through a serial arrangement of a metalization layer 140, a plated through hole 130 with a plated metal 132, and a metalization layer 142. The blind via 150 is electrically coupled to an electronic assembly 162, such as a chip, by a C4 solder ball 160. The geometric details of the coupling of the C4 solder ball 160 to the metallic plating 152 of the blind via 150 includes any solder configuration known to one of ordinary skill in the art. The blind via 154 is electrically coupled to an electronic carrier 172, such as a circuit card, by a BGA solder ball 160 on the BGA pad 156. The electronic assembly 162 and the electronic carrier 172 are examples of an electronic device that may be conductively coupled to a blind via within the PID layer 122 or the PID layer 124.

Figure 10:
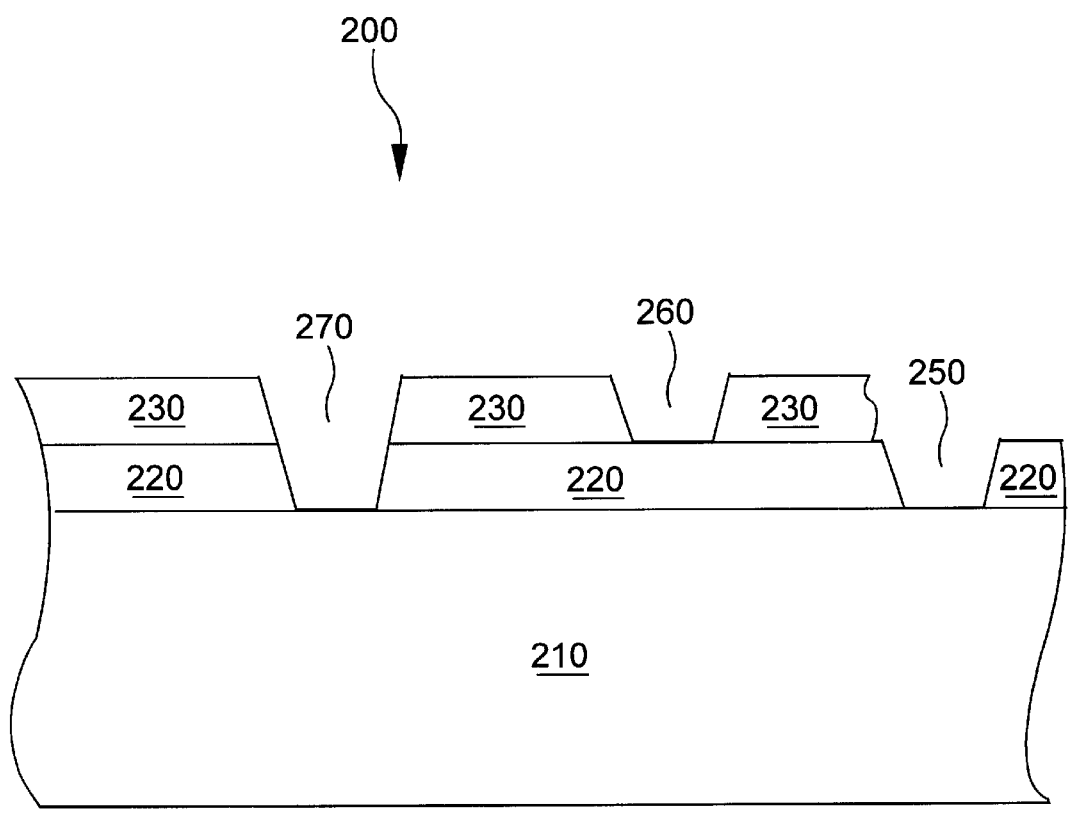
FIG. 10 illustrates a front cross-sectional view of a stacked PID electrical structure, in accordance with a fourth preferred embodiment of the present invention.

FIG. 10 illustrates a front cross-sectional view of a stacked PID electrical structure 200, in accordance with a fourth preferred embodiment of the present invention. FIG. 10 depicts a first PID layer 220 on substrate 210, and a second PID layer 230 on the first PID layer 220. The first PID layer 220 includes an obtuse-angled blind via 250. The obtuse-angled blind via 250 may be formed either by photoimaging followed by laser ablation, or by laser ablation without prior photoimaging, as described supra. Although not shown, the PID layer 220 may also include an acute-angle blind via formed by photoimaging. The second PID layer 230 includes an obtuse-angled blind via 260. The obtuse-angled blind via 260 may be formed either by photoimaging followed by laser ablation, or by laser ablation without prior photoimaging, as described supra. Although not shown, the second PID layer 230 may also include an acute-angle blind via formed by photoimaging. The first PID layer 220 and the second PID layer 230 may be electrically coupled by an interfacial circuitization layer (not shown). An obtuse-angled blind via 270 is within both the first PID layer 220 and the second PID layer 230. The obtuse-angled blind via 270 may be formed by laser ablation without prior photoimaging, as described supra, but not by laser ablation with prior photoimaging, because it is impractical to photoimage more than one PID layer at a time. Thus, a particular advantage of using laser ablation without prior photoimaging is the capability of forming an obtuse-angled blind via in a stacked PID layer structure.

While preferred and particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:
1. An electrical structure, comprising:
   a substrate;
   a photoimageable dielectric (PID) layer on the substrate, wherein the PID layer includes a PID material that is cross-linkable, wherein the PID material becomes cross-linked when exposed to light characterized by a wavelength; and a blind via within the PID layer, said blind via having a obtuse-angled sidewall.

2. The electrical structure of claim 1, wherein the blind via is plated with a metallic layer, further comprising an electronic device conductively coupled to the metallic layer.

3. The electrical structure of claim 2, wherein the electronic device includes an electronic assembly conductively coupled to the metallic layer with an interfacing controlled collapse chip connection (C4) solder ball.

4. The electrical structure of claim 2, wherein the electronic device includes an electronic carrier conductively coupled to the metallic layer with an interfacing ball grid array (BGA) solder ball.

5. The electrical structure of claim 1, further comprising a second blind via within the PID layer, said second blind via having an acute-angled sidewall.

6. The electrical structure of claim 1, wherein an obtuse angle of the obtuse-angled sidewall is between about 130 degrees and about 160 degrees.

7. The electrical structure of claim 1, further comprising:

a second PID layer on the PID layer; and an obtuse-angled blind via within the second PID layer.

8. The electrical structure of claim 1, further comprising:

a stacked PID layer, including the PID layer and a second PID layer on the PID layer; and an obtuse-angled blind via through the stacked PID layer.

9. The electrical structure of claim 1, further comprising:

a second PID layer on the substrate; and an obtuse-angled blind via within the second PID layer, wherein the obtuse-angled blind via within the second PID layer is electrically coupled to the blind via within the PID layer, said electrical coupling including a plated through hole.

10. A method of forming an electrical structure, comprising:

providing a substrate;

forming a photoimageable dielectric (PID) layer on the substrate, wherein the PID layer includes a PID material that is cross-linkable, wherein the PID material becomes cross-linked when exposed to light characterized by a wavelength; and forming a blind via in the PID layer, said blind via having an obtuse-angled sidewall.

11. The method of claim 10, wherein the step of forming a blind via comprises laser ablating a volume of PID material within the PID layer.

12. The method of claim 10, further comprising forming a second blind via within the PID layer, including forming an acute-angled sidewall of the second blind via.

13. The method of claim 10, further comprising:

plating the blind via with a metallic layer; and conductively coupling an electronic device to the metallic layer.

14. The method of claim 13, wherein the electronic device includes an electronic assembly, and wherein the conductively coupling step includes conductively coupling the electronic assembly to the metallic layer with an interfacing controlled collapse chip connection (C4) solder ball.

15. The method of claim 13, wherein the electronic device includes an electronic carrier, and wherein the conductively coupling step includes conductively coupling the electronic carrier to the metallic layer with an interfacing ball grid array (BGA) solder ball.

16. The method of claim 10, further comprising:

forming a second PID layer on the PID layer; and forming an obtuse-angled blind via within the second PID layer.

17. The method of claim 10, further comprising:

forming a second PID layer on the PID layer; and forming an obtuse-angled blind via through a stacked PID layer, wherein the stacked PID layer includes the PID layer and the second PID layer.

18. A method of forming an electrical structure, comprising:

providing a substrate;

forming a photoimageable dielectric (PID) layer on the substrate; and forming a blind via in the PID layer, said blind via having an obtuse-angled sidewall making an angle of between about 130 degrees and about 160 degrees with a blind end of the blind via.

19. A method of forming an electrical structure, comprising: providing a substrate; forming a photoimageable dielectric (PID) layer on the substrate, and forming a blind via in the PID layer, said blind via having an obtuse-angled sidewall, wherein forming the blind via comprises:

forming the blind via having an acute-angled sidewall; and laser ablating the acute-angled sidewall to form the obtuse-angled sidewall.

20. The method of claim 19, wherein the step of forming the blind via having an acute-angled sidewall includes forming the blind via having an aspect ratio of at least about 1.

21. The method of claim 19, wherein the step of forming the blind via having an acute-angled sidewall includes forming the blind via having an open end width less than about 3 mils.

22. A method of forming an electrical structure, comprising:

providing a substrate;

forming a photoimageable dielectric (PID) layer on the substrate;

forming a blind via in the PID layer, said blind via having an obtuse-angled sidewall;

forming a second PID layer on the substrate;

forming a obtuse-angled blind via within the second PID layer; and forming a plated through hole (PTH) through the substrate, wherein the PTH couples the obtuse-angled blind via within the second PID layer to the blind via within the PID layer.

* * * * *